(12) United States Patent
Hayamizu et al.

(10) Patent No.: US 7,081,422 B2
(45) Date of Patent: Jul. 25, 2006

(54) MANUFACTURING PROCESS FOR ANNEALED WAFER AND ANNEALED WAFER

(75) Inventors: Yoshinori Hayamizu, Annaka (JP); Satoshi Tobe, Annaka (JP); Norihiro Kobayashi, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 330 days.

(21) Appl. No.: 10/220,145

(22) PCT Filed: Dec. 11, 2001

(86) PCT No.: PCT/JP01/10846

§ 371 (c)(1),
(2), (4) Date: Aug. 28, 2002

(87) PCT Pub. No.: WO02/49091

PCT Pub. Date: Jun. 20, 2002

(65) Prior Publication Data

US 2003/0013321 A1 Jan. 16, 2003

(30) Foreign Application Priority Data

Dec. 13, 2000 (JP) ........................................ 2000-378968

(51) Int. Cl.
*H01L 21/26* (2006.01)
*C30B 15/00* (2006.01)

(52) U.S. Cl. ......................................... 438/795; 117/13
(58) Field of Classification Search ................. 438/795; 117/11, 13, 19, 20
See application file for complete search history.

(56) References Cited

U.S. PATENT DOCUMENTS 4,661,166 A   4/1987 Hirao .......................... 148/1.5
6,204,152 B1 * 3/2001 Falster et al. ............... 438/473
6,365,461 B1 * 4/2002 Asayama et al. ........... 438/268
6,544,656 B1 * 4/2003 Abe et al. .................... 428/446

FOREIGN PATENT DOCUMENTS

| EP | 1 035 236 A1 | 9/2000 |
| JP | 58-018929 | 2/1983 |
| JP | 60-133734 | 7/1985 |
| JP | 08-162461 | 6/1996 |
| JP | 08-213403 | 8/1996 |
| JP | 09-190954 | 7/1997 |
| JP | 09-199507 | 7/1997 |
| JP | 2000-072593 | 3/2000 |
| JP | 2000-072595 | 3/2000 |
| JP | 2000-077418 | 3/2000 |
| JP | 2000-281490 | 10/2000 |
| WO | WO00/12787 | 3/2000 |

OTHER PUBLICATIONS

International Search Report for PCT/JP01/10846 dated Mar. 12, 2002.

* cited by examiner

*Primary Examiner*—Scott B. Geyer
(74) *Attorney, Agent, or Firm*—Rader, Fishman & Grauer PLLC

(57) ABSTRACT

There are provided a heat-treating method capable of suppressing generation of slip in a CZ silicon single crystal wafer having a diameter of mainly 300 mm or more even under high temperature heat treatment to annihilate grown-in defects in the vicinity of a surface of the wafer, and an annealed wafer having a DZ layer in a surface layer of the wafer and oxide precipitates in the bulk thereof at a high density which exert a high gettering effect. First heat treatment of a silicon single crystal wafer manufactured from a silicon single crystal ingot pulled by means of a Czochralski method is performed at a temperature in the range of 600 to 1100° C. to form oxide precipitates in the bulk of the wafer, and thereafter, second heat treatment is performed at a temperature in the range of 1150 to 1300° C.

14 Claims, 2 Drawing Sheets

(a) Preparation of wafer (b) First heat treatment (c) Second heat treatment (a) Preparation of wafer W: wafer (b) High temperature heat treatment 12: slip dislocations W: wafer 10: boat contact portions

MANUFACTURING PROCESS FOR ANNEALED WAFER AND ANNEALED WAFER

TECHNICAL FIELD

The present invention relates to a manufacturing process for an annealed wafer in which a silicon single crystal wafer (hereinafter may be simply referred to as a wafer) having mainly a large diameter of 300 mm or more is heat-treated, and an annealed wafer obtained by the manufacturing process.

BACKGROUND ART

With the progress of high integration and high functionality of a semiconductor device using a silicon single crystal wafer, the silicon single crystal wafer used in device fabrication is becoming larger in diameter. At present, a 200 mm (8-inch) wafer is a main current of the kinds of wafer, but it is expected that a 300 mm wafer will advance into quantity production and in the near future the 300 mm wafer will be a main current thereof. In addition, a 400 mm wafer is thought to follow the 300 mm wafer as the next generation, for which the development is on the way. As a method growing a silicon single crystal ingot for manufacturing a silicon single crystal wafer having a diameter of 300 mm or more, nothing is available other than a Czochralski method (CZ method) in the current state of the art.

Then, it has been known that crystal defects named grown-in defects such as COP (Crystal Originated Particle) are incorporated into a silicon single crystal produced by the CZ method, and if such crystal defects exist in a device fabrication region in the vicinity of a wafer surface, device characteristics such as an oxide film dielectric break down strength are degraded.

As a resort to remove such grown-in defects from a wafer surface layer, a method has been adopted in which a CZ silicon single crystal wafer W is subjected to high temperature heat treatment, for example, at 1200° C. for one hour in a hydrogen atmosphere or an argon gas atmosphere. By the high temperature heat treatment, grown-in defects in the vicinity of a surface of a CZ silicon single crystal wafer are annihilated so that there is obtained a silicon single crystal wafer having a high quality DZ (Denuded Zone) layer in the wafer surface layer (hereinafter referred to as an annealed wafer).

DISCLOSURE OF THE INVENTION

It has been known, however, that if high temperature heat treatment is applied to a silicon single crystal wafer, slip dislocations 12 as shown in parts (a) and (b) of FIG. 2 are generated with ease at the periphery of the wafer and contact portions 10 of the wafer with a wafer supporting jig (a wafer boat). As described above, while slip dislocations may be generated in high temperature heat treatment for annihilating grown-in defects, there has not been generated so large slip dislocations in a conventional wafer of 200 mm or less in diameter and hence it is sufficiently able to avoid the slip dislocations therein to a degree at which no practical problem occurs by modifying a shape of a boat, adjusting heat treatment conditions such as temperature increase and decrease rates, or other measures.

On the other hand, it has been found that when high temperature heat treatment at 1200° C. for one hour is applied to a wafer of 300 mm in diameter in order to annihilate grown-in defects, large slip dislocations (long slip dislocations in length) are generated remarkably, and it is not able to avoid these slip dislocations by modifying the shape of the boat, or adjusting the heat treatment conditions such as the temperature increase and decrease rates.

The reason for the above could conceivably include the following points. A weight of a wafer itself increases greatly with increase in diameter thereof from 200 mm to 300 mm, which causes a large stress to be imposed on contact portions of the wafer with the boat. There has become normally used such a wafer as its diameter increases by a factor of 1.5, but its thickness increases only by a factor of 1.1 or less (for example, a thickness of 725 µm for a 200 mm wafer and a thickness of 775 µm for a 300 mm wafer), so that a resistance to slip dislocations decreases. A larger diameter increases a temperature difference across a wafer surface during temperature increase and decrease in heat treatment.

It has been generally known that when thermal stress is given to a silicon wafer containing oxide precipitates, slip dislocations may be generated from the oxide precipitates themselves, and for example, in JP A 98-150048, there are described findings that in the case where oxide precipitates are polyhedral precipitates or plate-like precipitates, when the sizes thereof become not less than about 200 nm or about 230 nm, respectively, slip dislocations are generated easily.

However, while the slip dislocations discussed here are generated from the oxide precipitates themselves, slip dislocations generated at contact portions of a wafer with a boat, which are taken up as a problem in the above description, are of a type that as shown in FIG. 2(b), slip dislocations 12 penetrate a wafer W from the back surface (at the contact portions 10 with the boat) up to the front surface; therefore, an idea came to mind that if obstacles such as oxide precipitates in the bulk of a wafer exist, growth of slip dislocations could be inversely suppressed. That is, the inventors have acquired a notion that if there are generated in the bulk oxide precipitates which are not so large in size as to generate slip dislocations from themselves, comparatively small in size and high in density, slip dislocations generated at the contact portions with the boat can be suppressed, which has lead to the present invention.

The present invention was made in order to solve the above problem and it is an object of the present invention to provide a heat-treating method capable of suppressing generation of slip dislocations in a CZ silicon single crystal wafer having a diameter of mainly 300 mm or more even under high temperature heat treatment to annihilate grown-in defects in the vicinity of a surface of the wafer, and provide an annealed wafer having a DZ layer in a surface layer of the wafer and oxide precipitates in the bulk thereof at a high density which exert a high gettering effect.

In order to solve the above problem, a manufacturing process for an annealed wafer of the present invention comprises the steps of performing first heat treatment of a silicon single crystal wafer manufactured from a silicon single crystal pulled by means of a Czochralski method at a temperature in the range of 600 to 1100° C. to form oxide precipitates in the bulk of the wafer; and thereafter, performing second heat treatment at a temperature in the range of 1150 to 1300° C.

As the silicon single crystal wafer, there can be used a wafer of 300 mm or more in diameter.

A nitrogen concentration in the silicon single crystal wafer is preferably in the range of $1\times10^{12}$ to $5\times10^{15}/cm^3$.

A density of the oxide precipitates in the bulk is preferably in the range of $5\times10^8$ to $5\times10^{12}/cm^3$.

As the first heat treatment, two stage heat treatment is preferably adopted including precipitate nuclei forming heat treatment performed at a temperature in the range of 600 to 900° C. and precipitate growing heat treatment following the precipitate nuclei forming heat treatment, performed at a temperature in the range of 950 to 1100° C.

The second heat treatment is preferably performed in a hydrogen atmosphere, an argon atmosphere, or a mixed gas atmosphere thereof.

An annealed wafer of the present invention is manufactured by means of a process of the present invention described above and has a DZ layer formed in a surface layer section thereof and a bulk section with an oxide precipitate density in the range of $5\times10^8$ to $5\times10^{12}/cm^3$.

BEST MODE FOR CARRYING OUT THE INVENTION

Description will be given of embodiments of the present invention below with reference to the accompanying drawings and it is needless to say that various changes and modifications can be implemented as far as not departing from the technical concept of the present invention in addition to examples shown in the figures.

As a CZ silicon single crystal wafer of 300 mm or more in diameter preferably used in the present invention, there can be used a wafer manufactured from a silicon single crystal ingot pulled by means of an ordinary CZ method or a so-called MCZ method pulling it under application of a magnetic field. In case of the CZ method in use, interstitial oxygen of the order in the range of 10 to 25 ppma (values as measured in accordance with Japan Electronic Industry Development Association (JAIDA) standard) can be inevitably or intentionally incorporated into a single crystal ingot. Though a reduced interstitial oxygen concentration can be obtained with the so-called MCZ method pulling the single crystal ingot under application of a magnetic field, even in this case, a concentration of interstitial oxygen incorporated in a single crystal amounts to a value of the order of several ppma.

If a CZ silicon single crystal wafer doped with nitrogen is used, in the first heat treatment to follow, oxygen precipitation is accelerated to generates oxide precipitates at a high density. In order to manufacture a silicon single crystal wafer doped with nitrogen, for example, a silicon wafer(s) with a nitride film is/are charged into a raw material silicon melt in pulling a silicon single crystal ingot, thereby enabling doping with nitrogen with ease. A nitrogen concentration incorporated into a pulled crystal can be calculated from the charged quantity of the silicon wafer(s) with the nitride film and a quantity of the raw material silicon melt on the basis of a segregation coefficient of nitrogen.

A preferable range of the nitrogen concentration for accelerating oxygen precipitation to obtain a high density of oxide precipitates is $1\times10^{12}$ to $5\times10^{15}/cm^3$. If the concentration is lower than the above range, the effect of accelerating oxygen precipitation may be insufficient, while if higher than the range, there is liable to hinder crystallization.

Since a size of a grown-in defect is decreased by doped nitrogen, the defect becomes easier to be annihilated in the second heat treatment to follow.

Figure 1:
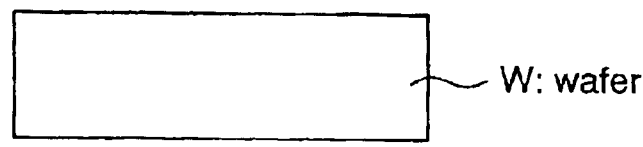
FIG. 1 is a schematic view showing a step sequence of a manufacturing process for an annealed wafer according to the present invention.
Figure 1:
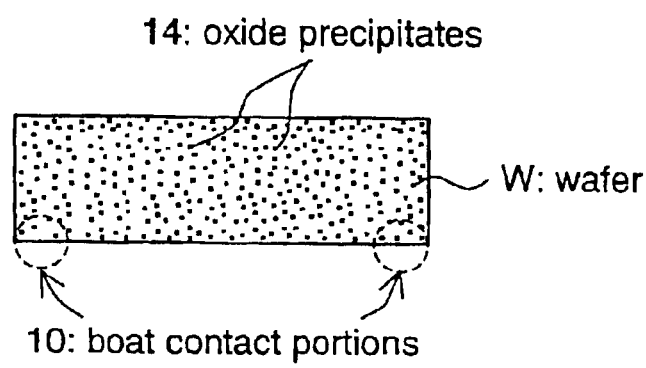
Figure 1:
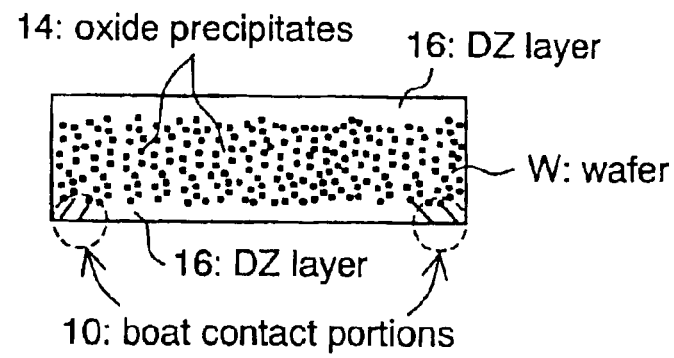
Figure 2:
FIG. 2 is a schematic view showing a step sequence of a conventional manufacturing process for an annealed wafer.
Figure 2:
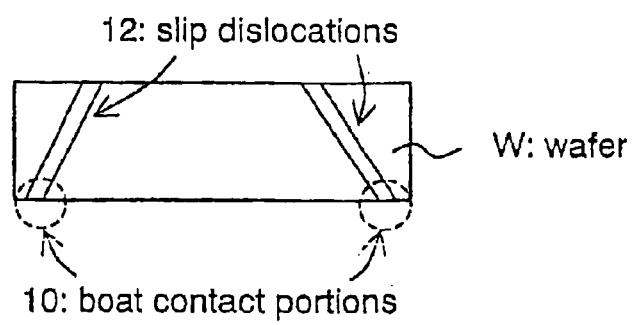

Description will be given with FIG. 1 of the embodiment where using the thus manufactured silicon single crystal wafer of 300 mm in diameter doped with nitrogen, heat treatment of the present invention is performed.

FIG. 1(a) shows a step of preparing a silicon single crystal wafer W of 300 mm in diameter doped with nitrogen to be subjected to heat treatment, in which there is prepared a silicon single crystal wafer W having a desired nitrogen concentration and a desired initial interstitial oxygen concentration in accordance with the above-mentioned method. As described above, a nitrogen concentration is preferably in the range of $1\times10^{12}$ to $5\times10^{15} cm^3$ and more preferably in the range of $1\times10^{13}$ to $5\times10^{14}$ atoms/cm$^3$. When an initial interstitial oxygen concentration is in the range of 12 to 20 ppma, a sufficient oxide precipitate density can be obtained and control of an oxygen concentration during pulling crystal is performed easily.

FIG. 1(b) shows a step of performing the first heat treatment of the wafer W. An object of the first heat treatment is to form minute oxide precipitates 14 at a high density in the bulk, which are not dissolved in the second high temperature heat treatment. Then, precipitate nuclei are first formed sufficiently in the heat treatment at a comparatively low temperature and thereafter, the precipitate nuclei are grown by heat treatment at a temperature higher than the previous heat treatment. For the purpose, two-stage heat treatment is preferably adopted wherein precipitate nuclei forming heat treatment is performed in the range of 600 to 900° C. and precipitate growing heat treatment is performed in the range of 950 to 1100° C.

If a temperature in the first stage of the two-stage heat treatment is lower than 600° C., a time required for nuclei formation is extremely long, whereas if the temperature exceeds 900° C., it is harder to form nuclei. If a temperature in the second stage is lower than 950° C., there is extremely long a time required for obtaining nuclei grown up to a state where sufficient sizes thereof become not to be annihilated by high temperature heat treatment, whereas if the temperature exceeds 1100° C., it is risky that precipitate nuclei having been expressly formed in the first stage heat treatment are redissolved and slip dislocations may be generated in the second stage heat treatment.

Note that in case of a silicon single crystal wafer doped with nitrogen, since there have been formed in advance of the crystal growth due to the nitrogen doping effect precipitates which are not dissolved even in heat treatment at 1100° C. and stable at a high temperature, the nuclei forming heat treatment (600 to 900° C.) of the first stage in the two-stage heat treatment is not always necessary, but performing this heat treatment is more effective than nothing.

By performing the first heat treatment, there can be attained a wafer with a density of oxide precipitates 14 of $5\times10^8$ to $5\times10^{12}/cm^3$ in the bulk thereof, the presence of the oxide precipitates 14 leads to the suppression of the slip dislocations growth in the second heat treatment, with the result that the slip dislocations can be decreased.

FIG. 1(c) shows a step of the second heat treatment. The wafer W having oxide precipitates 14 which are formed in the bulk thereof in the first heat treatment, comparatively small in size and high in density, has also the oxide precipitates 14 in the vicinity of a surface thereof which is used as a device fabrication region, so device characteristics are greatly decreased if the wafer is used for fabrication of the device without any further treatment. Then, in order to form a DZ layer 16 by outdiffusing the oxide precipitates 14 in the vicinity of the surface, the second heat treatment is performed at a high temperature in the range of 1150 to 1300° C.

A heat treatment atmosphere is preferably a hydrogen gas atmosphere, an argon atmosphere or a mixed gas atmosphere thereof With the atmosphere in use, not only oxide precipitates but also grown-in defects such as COP can be annihilated. A heat treatment time is preferably in the range of 1 to 5 hr in view of sufficient formation of a DZ layer in the surface layer region and its productivity.

While the oxide precipitates 14 in the vicinity of a wafer surface are annihilated by an effect of outdiffusion of oxygen in the second heat treatment, in the interior (bulk section) in which no effect of outdiffusion is exerted, the oxide precipitates 14 formed by the first heat treatment are not redissolved but grow so that the sizes of the oxide precipitates 14 increase with almost no change in density, thereby a gettering effect being improved. In order to lower a redissolution percent of the oxide precipitates 14 in the bulk section and to grow them with certainty, a temperature in the second heat treatment is preferably in the range of 1150 to 1250° C., and more preferably in the range of 1150 to 1230° C. In the temperature range of 1150 to 1230° C. of the second heat treatment, in order that the oxide precipitates 14 grow in the bulk except for the surface layer section without redissolution, critical sizes thereof are on the order of 1 to 10 nm.

EXAMPLE

Description will be given of the present invention below by way of the following examples which should be construed illustrative rather than restrictive.

Example 1

<Wafer in Use>

A diameter of 300 mm, p type, a crystal axis orientation <100>, a resistivity of 10 Ωcm, a nitrogen concentration of $5 \times 10^{13}$ atoms/cm$^3$, and an initial interstitial oxygen concentration of 14 ppma (values as measured in accordance with Japan Electronic Industry Development Association (JAIDA) standard)

<First Heat Treatment>

800° C., 4 hr+1000° C., 16 hr; a 100% argon atmosphere

<Second Heat Treatment>

1200° C., 1 hr; a 100% argon atmosphere

<Measurement>

1) Observation of slip dislocations is performed by the X-ray topographic method.

2) A DZ layer and an oxide precipitate density are measured by observation under an optical microscope of a wafer etched with a preferential etching solution containing no hexa-valent chromium ion according to a testing method of crystal defects in silicon by preferential etching method priscribed in Japanese Industrial Standard (JIS H 0609:1999) after angle polishing.

The wafer above described was subjected to the first heat treatment and the second heat treatment under the above-mentioned conditions and slip dislocations, a DZ layer and an oxide precipitate density thereof were measured with the above-mentioned methods. Results of the measurements are shown in Table 1. As shown in Table 1, in Example 1, no generation of slip dislocations in the wafer was observed, a DZ layer with a sufficient width was formed in a surface layer section thereof and an oxide precipitate density in the bulk thereof was sufficiently high.

Comparative Example 1

Using a wafer with the same specifications as the wafer of Example 1, the first heat treatment of Example 1 was omitted, and only the second heat treatment was performed. Results of the measurements are shown in Table 1. As is clear in Table 1, large slip dislocations in the wafer were observed and a DZ layer was present in a surface layer section thereof, but an oxide precipitate density in the bulk thereof was low.

Example 2

<Wafer in Use>

A diameter of 300 mm, p type, a crystal axis orientation <100>, a resistivity of 10 Ωcm, undoped with nitrogen, and an initial interstitial oxygen concentration of 16 ppma <First Heat Treatment>

700° C., 4 hr+1000° C., 8 hr; a nitrogen atmosphere with an oxygen concentration of 3%

<Second Heat Treatment >

1150° C., 4 hr; a 100% argon atmosphere

The first heat treatment and the second heat treatment were applied to the wafer under the above-mentioned conditions, then slip dislocations, a DZ layer and an oxide precipitate density were measured in a similar way as in Example 1, and results of the measurements are shown in Table 1. As shown in Table 1, in Example 2, no generation of slip dislocations in the wafer was observed, a DZ layer with a sufficient width was formed in a surface layer section thereof and an oxide precipitate density in the bulk thereof was sufficiently high.

Comparative Example 2

Using a wafer with the same specifications as the wafer of Example 2, the first heat treatment of Example 2 was omitted, and only the second heat treatment was performed. Results of the measurements are shown in Table 1. As is clear in Table 1, large slip dislocations in the wafer were observed, and a DZ layer was present in a surface layer section thereof, but an oxide precipitate density in the bulk thereof was low.

TABLE 1

(Measurement Results)

| | Slip | DZ layer width | Oxide precipitate density |
|---|---|---|---|
| Example 1 | None | 15 μm | $3 \times 10^9/cm^3$ |
| Comparative Example 1 | 180 mm of total length | 70 μm | $2 \times 10^8/cm^3$ |
| Example 2 | None | 12 μm | $4 \times 10^9/cm^3$ |
| Comparative Example 1 | 130 mm of total length | >70 μm | $<1 \times 10^8/cm^3$ |

CAPABILITY OF EXPLOITATION IN INDUSTRY

According to the present invention, as described above, generation of slip dislocations can be suppressed and grown-in defects in the vicinity of a wafer surface can be sufficiently annihilated even in high temperature heat treatment of a CZ silicon single crystal wafer of mainly 300 mm or more in diameter. An annealed wafer of the present invention has a DZ layer in a surface layer section thereof, and oxide precipitates at a high density capable of exerting a high gettering effect in the bulk thereof prior to loading the wafer into a device process.

What is claimed is:

1. A manufacturing process for an annealed wafer comprising the steps of:
   performing first heat treatment of a silicon single crystal wafer manufactured from a silicon single crystal pulled by means of a Czochralski method at a temperature in the range of 600 to 1100° C. to form oxide precipitates in the bulk of the wafer, and thereafter,
   performing second heat treatment at a temperature in the range of 1150 to 1300° C.,
   wherein the first heat treatment is a two stage heat treatment including a precipitate nuclei forming heat treatment performed at a temperature in the range of 600 to 900° C. and a precipitate growing heat treatment following the precipitate nuclei forming heat treatment, performed at a temperature in the range of 950 to 1100° C, and
   wherein the second heat treatment is performed in a hydrogen atmosphere, an argon atmosphere, or a mixed gas atmosphere thereof.

2. The manufacturing process for an annealed wafer according to claim 1, wherein a diameter of the silicon single crystal wafer is 300 mm or more.

3. The manufacturing process for an annealed wafer according to claim 2, wherein a nitrogen concentration in the silicon single crystal wafer is in the range of $1\times10^{12}$ to $5\times10^{15}$/cm$^3$.

4. An annealed wafer manufactured by means of the manufacturing process according to claim 3 and having a DZ layer formed in a surface layer section thereof and a bulk section with an oxide precipitate density in the range of $5\times10^8$ to $5\times10^{12}$/cm$^3$.

5. The manufacturing process for an annealed wafer according to claim 3, wherein a density of the oxide precipitates is in the range of $5\times10^8$ to $5\times10^{12}$/cm$^3$.

6. The manufacturing process for an annealed wafer according to claim 2, wherein a density of the oxide precipitates is in the range of $5\times10^{1012}$ to $\times1^{12}$/cm$^3$.

7. The manufacturing process for an annealed wafer according to claim 6, wherein a density of the oxide precipitates is in the range of $5\times10^8$ to $5\times10^{12}$/cm$^3$.

8. An annealed wafer manufactured by means of the manufacturing process according to claim 7 and having a DZ layer formed in a surface layer section thereof and a bulk section with an oxide precipitate density in the range of $5\times10^8$ to $5\times10^{12}$/cm$^3$.

9. The manufacturing process for an annealed wafer according to claim 1, wherein a nitrogen concentration in the silicon single crystal wafer is in the range of $1\times10^{12}$ to $5\times10^{15}$/cm$^3$.

10. An annealed wafer manufactured by means of the manufacturing process according to claim 9 and having a DZ layer formed in a surface layer section thereof and a bulk section with an oxide precipitate density in the range of $5\times10^8$ to $5\times10^{12}$/cm$^3$.

11. The manufacturing process for an annealed wafer according to claim 3, wherein a density of the oxide precipitates is in the range of $5\times10^8$ to $5\times10^{12}$/cm$^3$.

12. The manufacturing process for an annealed wafer according to claim 1, wherein a density of the oxide precipitates is in the range of $1\times10^{12}$ to $5\times10^{15}$/cm$^3$.

13. An annealed wafer manufactured by means of the manufacturing process according to claim 12 and having a DZ layer formed in a surface layer section thereof and a bulk section with an oxide precipitate density in the range of $5\times10^8$ to $5\times10^{12}$/cm$^3$.

14. An annealed wafer manufctured by means of the manufacturing process according to claim 1 and having a DZ layer formed in a surface layer sectiion thereof and a bulk with an oxide precipitate density in the range of $5\times10^8$ to $5\times10^{12}$/cm$^3$.

* * * * *